(12) United States Patent
Han et al.

(10) Patent No.: US 12,028,061 B2
(45) Date of Patent: Jul. 2, 2024

(54) HIGH SPEED 4:1 MULTIPLEXER

(71) Applicant: Industry-University Cooperation Foundation Hanyang University, Seoul (KR)

(72) Inventors: Jaeduk Han, Seoul (KR); Jeonghyu Yang, Seoul (KR); Hyuntae Kim, Seoul (KR); Hyeongmin Seo, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 18/082,829

(22) Filed: Dec. 16, 2022

(65) Prior Publication Data

US 2023/0208418 A1 Jun. 29, 2023

(30) Foreign Application Priority Data

Dec. 27, 2021 (KR) .................. 10-2021-0188946

(51) Int. Cl.
*H03K 17/693* (2006.01)
(52) U.S. Cl.
CPC .................. *H03K 17/693* (2013.01)
(58) Field of Classification Search
CPC .................................................. H03K 17/693
See application file for complete search history.

(56) References Cited

U.S. PATENT DOCUMENTS

| | | | |
|---|---|---|---|
| 9,742,597 B1* | 8/2017 | Chang | H04L 25/03057 |
| 10,489,116 B1* | 11/2019 | Esposito | G06F 15/7867 |
| 2012/0223847 A1* | 9/2012 | Mazumdar | G06F 1/0356 |
| | | | 341/100 |
| 2019/0212984 A1* | 7/2019 | Boersma | G06F 7/57 |
| 2022/0236907 A1* | 7/2022 | Kim | G06F 3/0655 |

FOREIGN PATENT DOCUMENTS

| | | |
|---|---|---|
| JP | 2003-324405 A | 11/2003 |
| JP | 2015-154484 A | 8/2015 |
| KR | 10-2008-0052227 A | 6/2008 |

* cited by examiner

*Primary Examiner* — Sibin Chen
(74) *Attorney, Agent, or Firm* — Sughrue Mion, PLLC

(57) ABSTRACT

A high-speed 4:1 multiplexer according to an embodiment comprises an input circuit unit including a first circuit that receives a first data as an input signal, and outputs a first output data as an output signal, a second circuit that receives a second data as an input signal, and outputs a second output data as an output signal, a third circuit that receives a third data as an input signal, and outputs a third output data as an output signal, and a fourth circuit that receives a fourth data as an input signal, and outputs a fourth output data as an output signal, a first stage for dividing the output data of the input circuit unit by two and receiving as an input signal, and outputting a first intermediate data and a second intermediate data as an output signal and a second stage of receiving the first intermediate data and the second intermediate data as an input signal and outputting a final data as an output signal.

13 Claims, 10 Drawing Sheets

[FIG. 1]
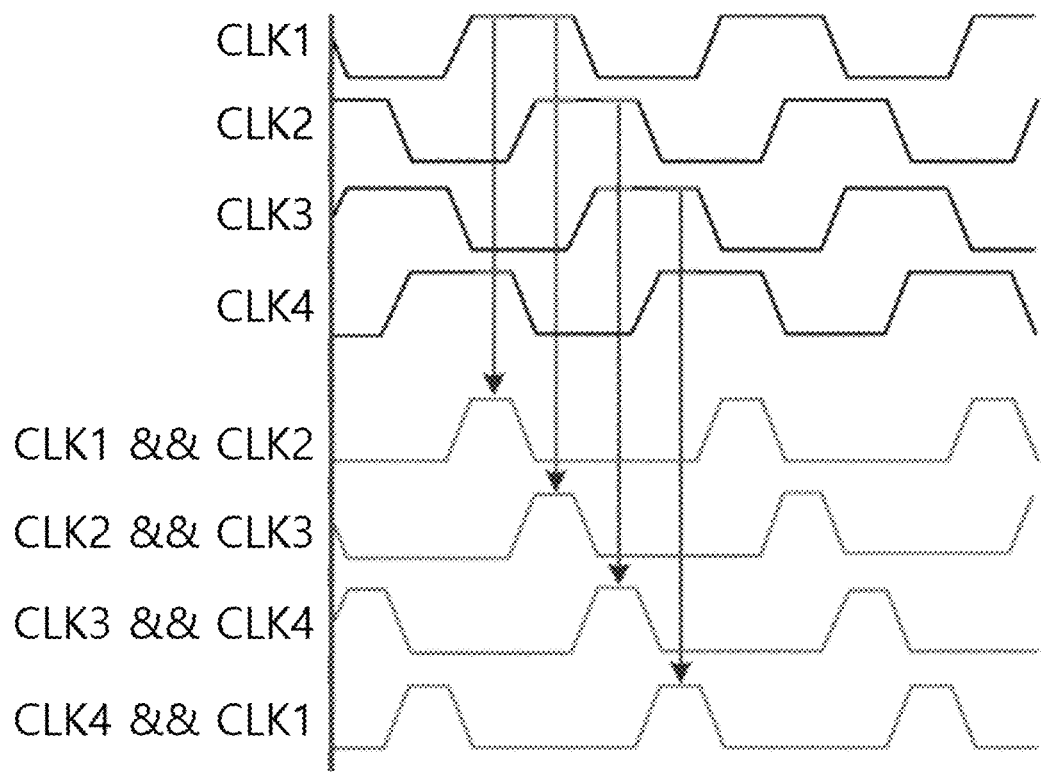

[FIG. 2]
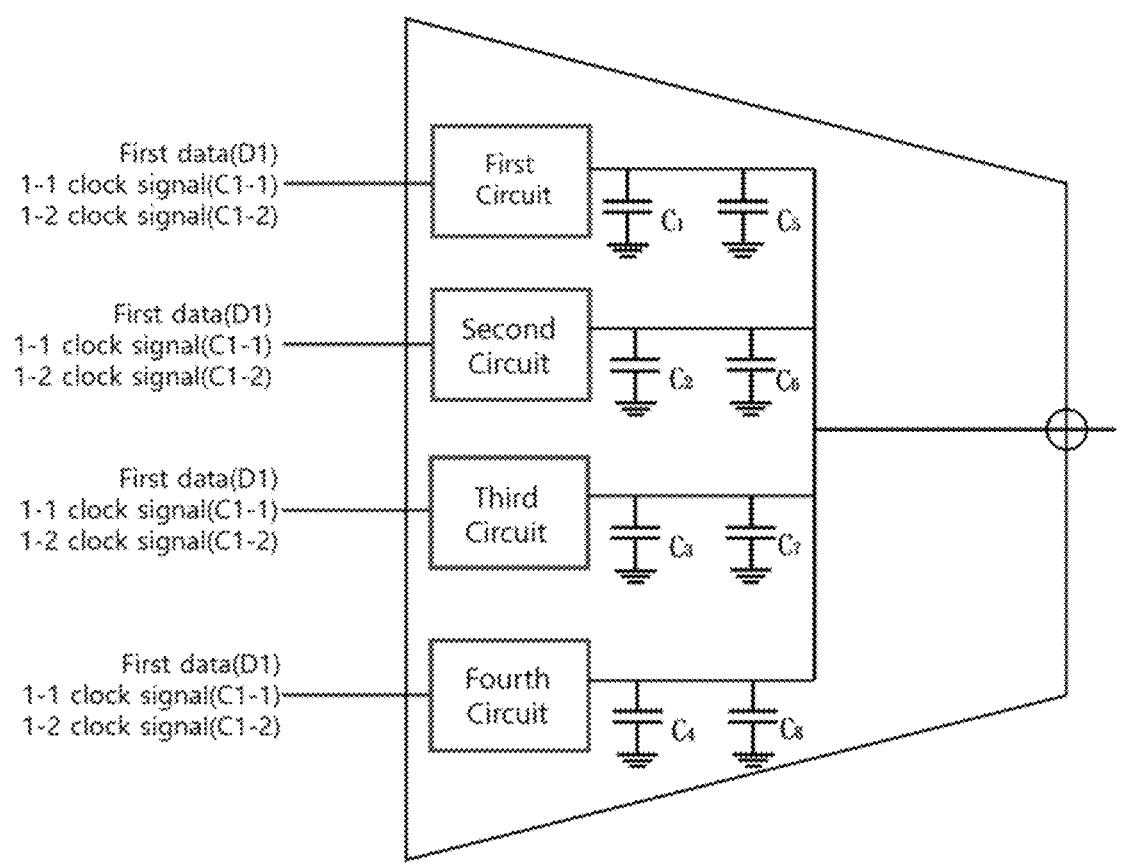

[FIG. 3]
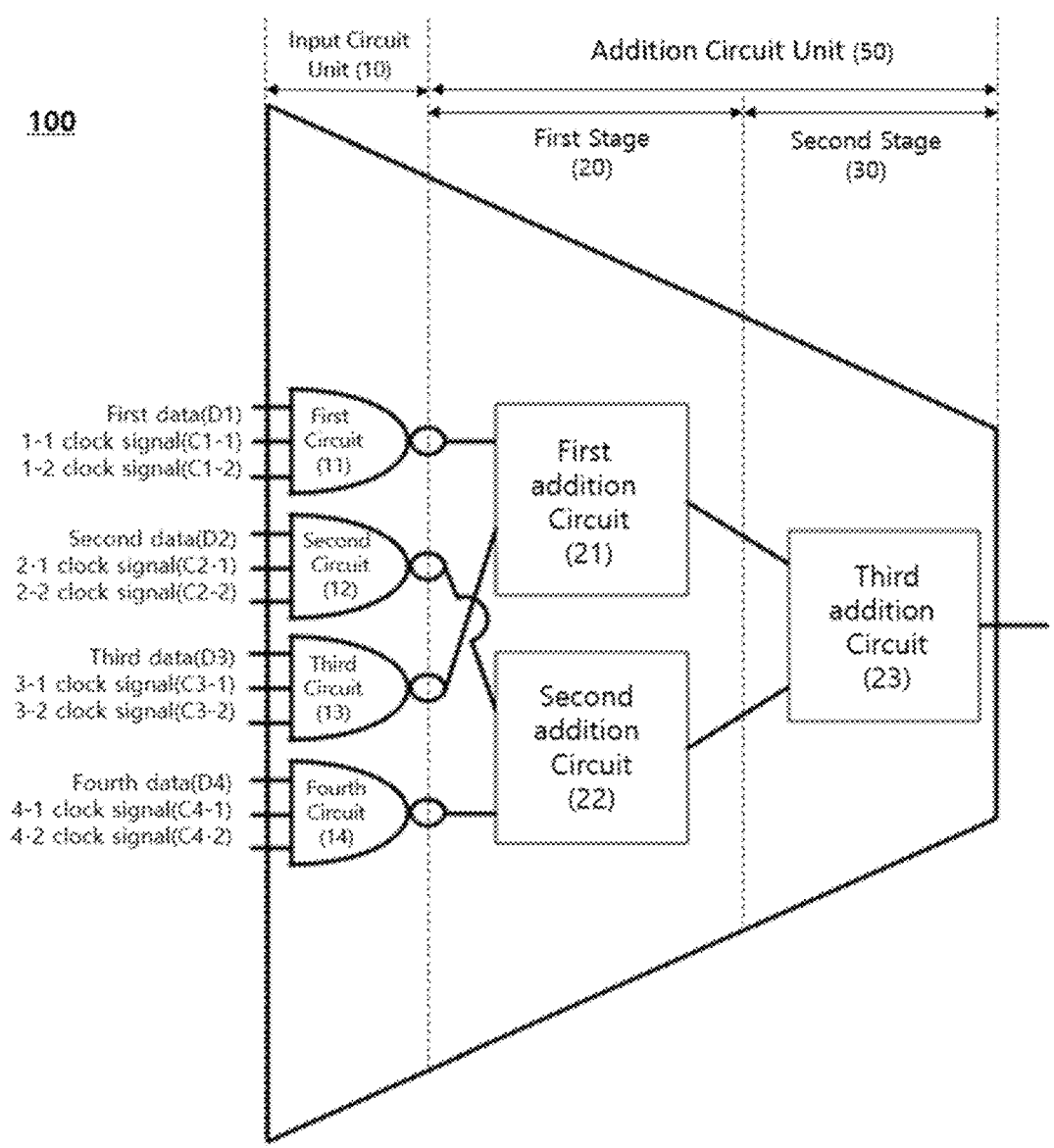

[FIG. 4]
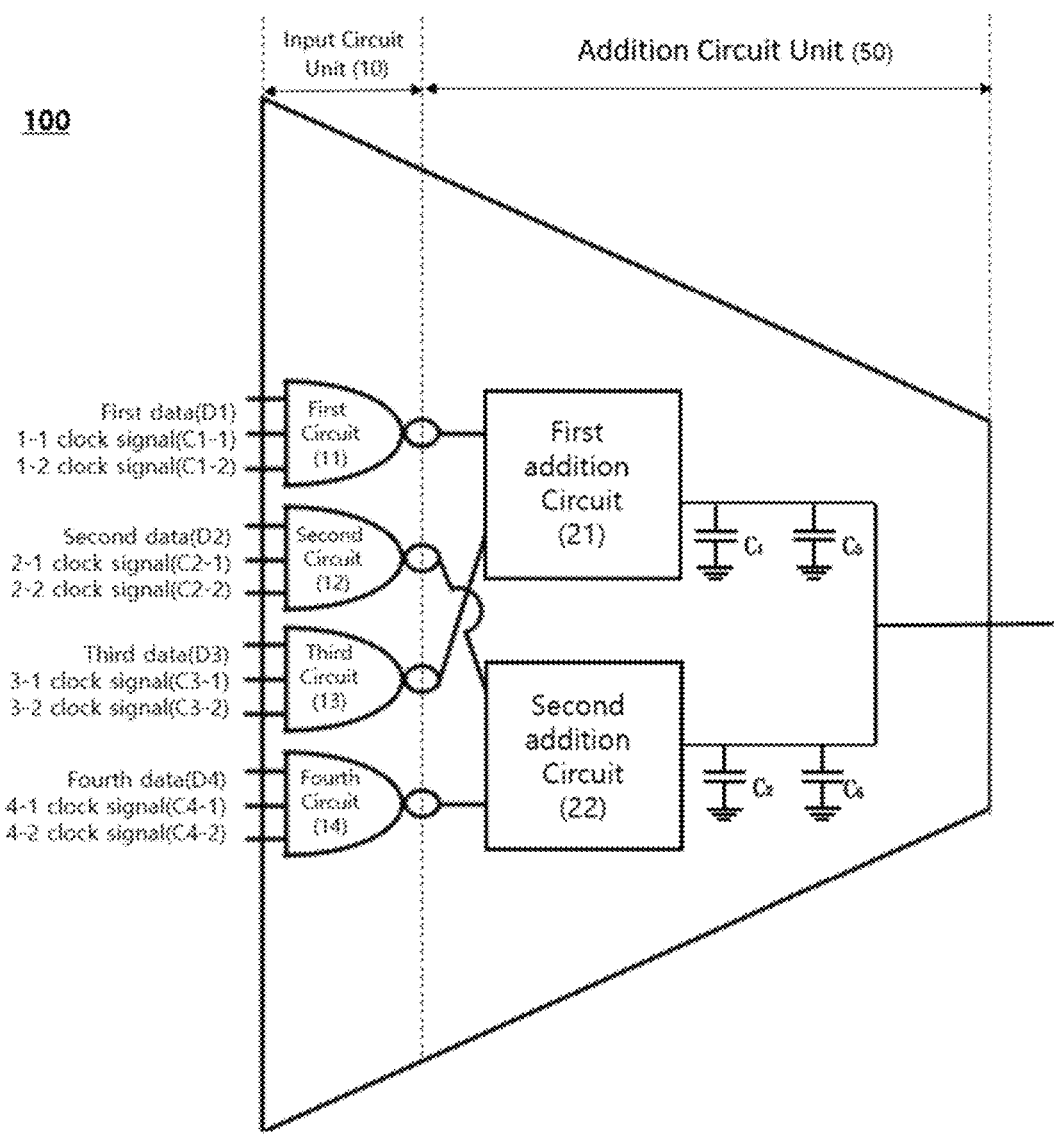

[FIG. 5]
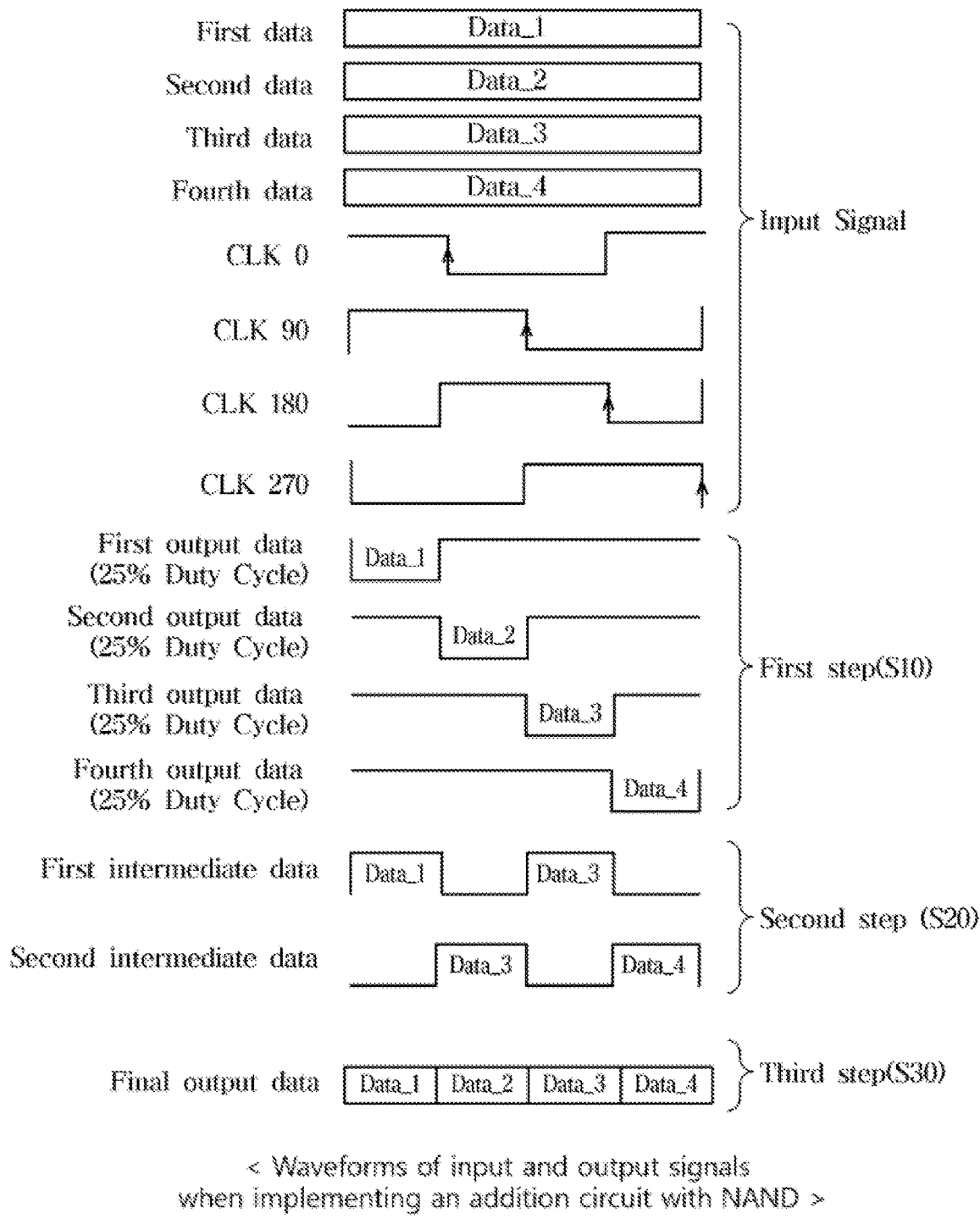

[FIG. 6]
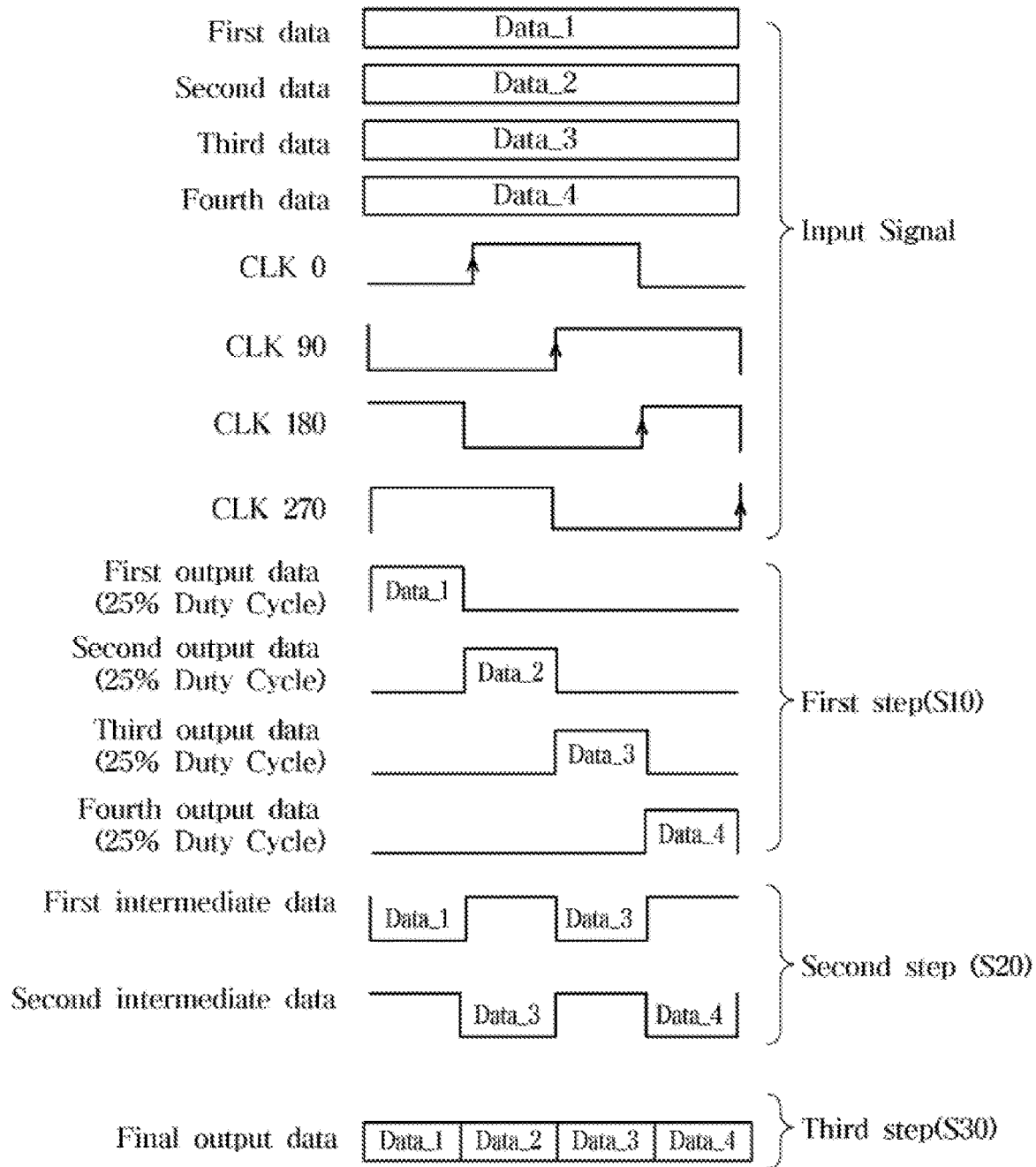
< Waveforms of input and output signals
when implementing an addition circuit with NOR >

[FIG. 7]
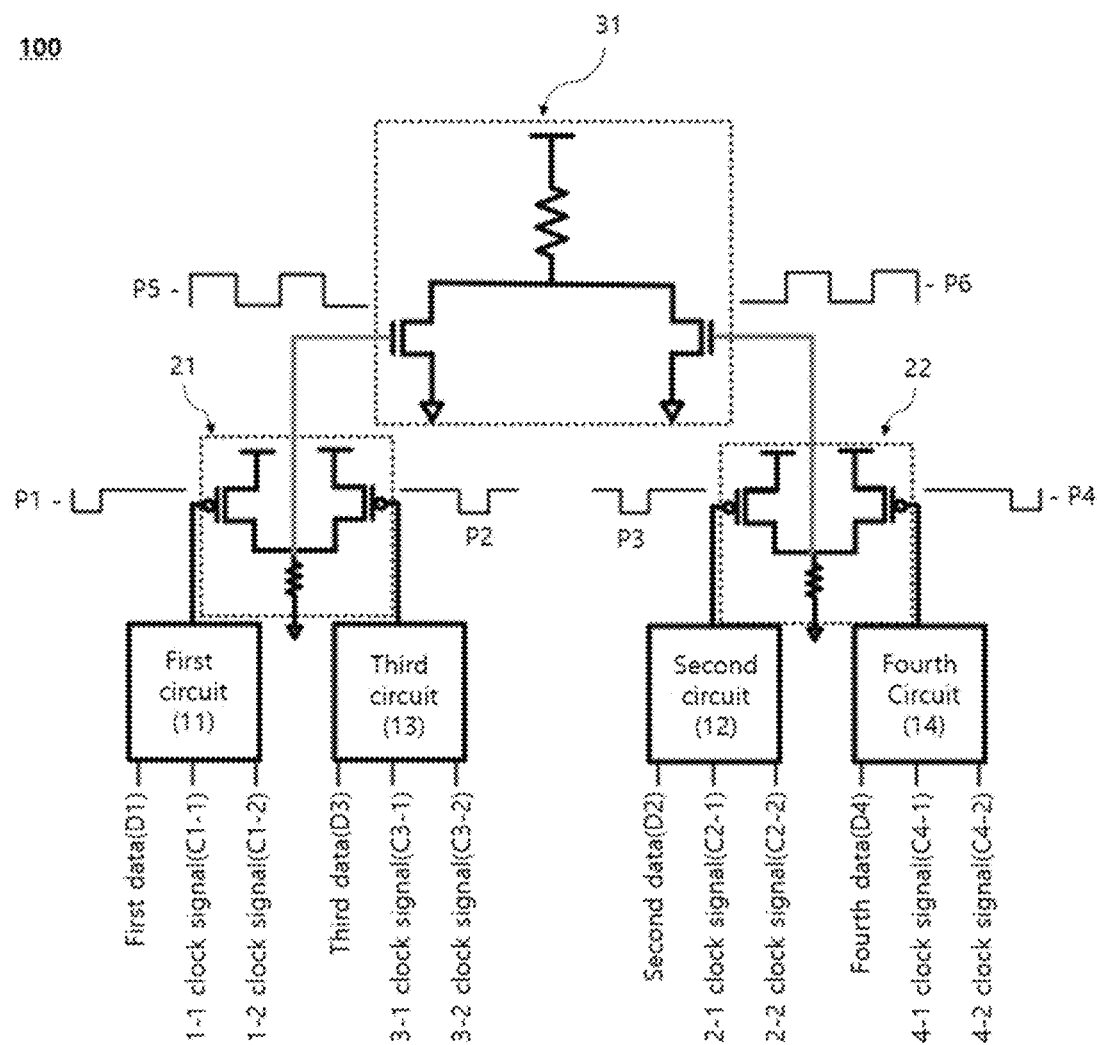

[FIG. 8]
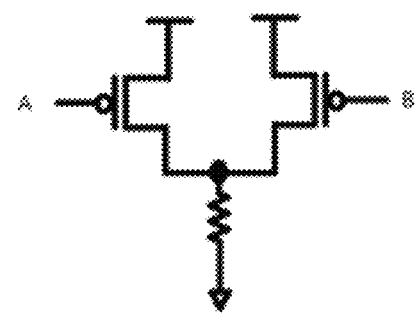
(a) 1 stack NAND
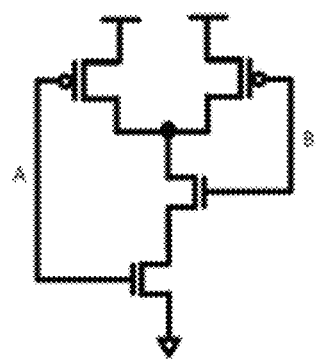
(b) CMOS type NAND

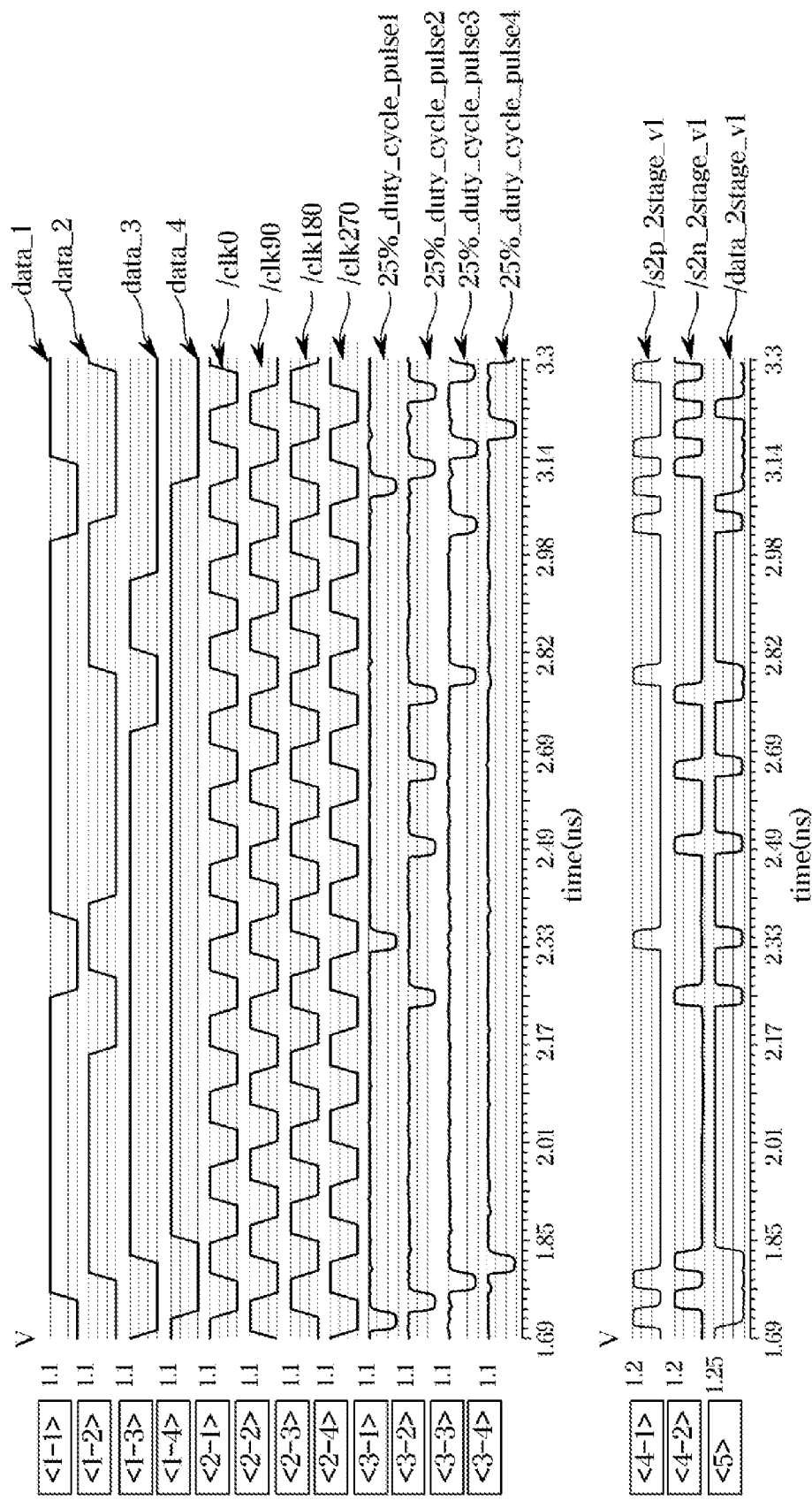
[FIG. 9]

[FIG. 10]
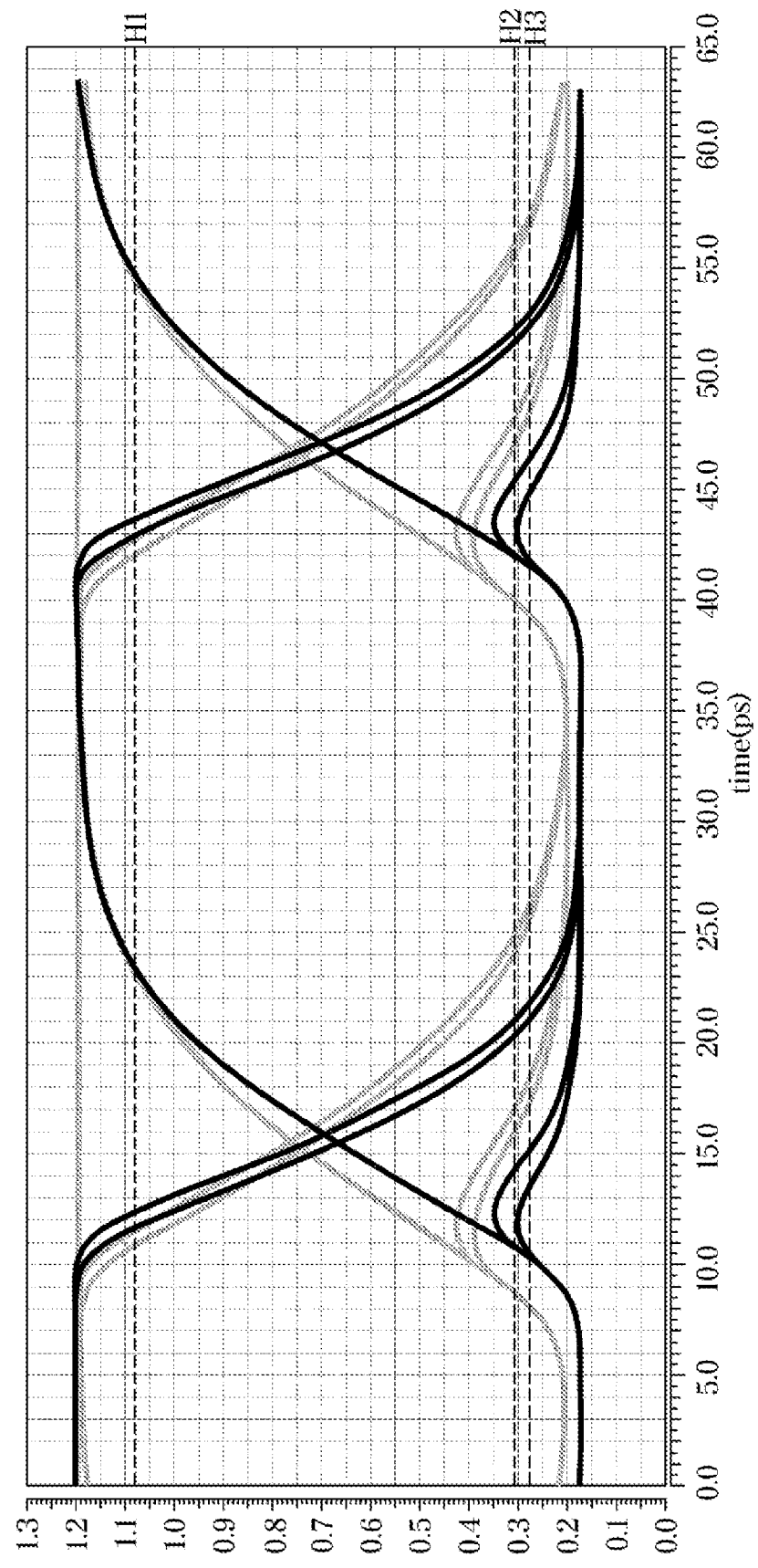

HIGH SPEED 4:1 MULTIPLEXER

FIELD OF THE DISCLOSURE

This application claims priority from Korean Patent Application No. 10-2021-0188946, filed on Dec. 27, 2021 in the Korean Intellectual Property Office, the disclosure of which is incorporated herein by reference.

BACKGROUND

The present invention relates to a high-speed 4:1 multiplexer. Specifically, it is an invention relates to a technology for increasing the speed of the multiplexer by minimizing parasitic capacitors generated at the output terminal by transforming the structure of the input terminal of the multiplexer into a two-layer structure using an Adder.

A current mode logic circuit is a type of semiconductor logic device, and refers to a non-saturation type high-speed logic circuit configured using differentially connected current switches.

High-speed operation signal processing circuits are implemented using a technique called Current Mode Logic (CML). Generally, they are configured in the form of using a resistive element as a load in a differential amplifier, so it has the advantage of achieving higher operating speed than the complementary metal-oxide semiconductor (CMOS) method in which NMOS (N-channel metal oxide semiconductor) or PMOS (P-channel metal oxide semiconductor) devices are connected in pairs.

On the other hand, a combination circuit that selects one of several input lines and connects them to a single output line is called a multiplexer (MUX), and the multiplexer is generally implemented using the current mode logic circuit described above.

For example, a multiplexer that selects one of four input lines and outputs it as a single output line is referred to as a 4:1 multiplexer. The 4:1 multiplexer implements a 4:1 multiplexer by connecting four current-mode-logic circuits in parallel and making the phase difference of signals output from each current-mode logic circuit 90 degrees. In this case, a total of four clocks CLK1, CLK2, CLK3, and CLK4 are used in each current mode logic circuit, and each clock has a phase difference of 90 degrees.

Specifically, as shown in FIG. 1, through a combination of a total of four clocks ((CLK1 & CLK2), (CLK2 & CLK3), (CLK3 & CLK4), (CLK4 & CLK1)), each current mode logic circuit can generate four 25% Duty Cycle Pulses having only one phase among specific phases (0, 90, 180, 360).

If a current mode logic circuit is driven using 25% duty cycle pulses, 4 pieces of information can be put in one cycle of the original clock (CLK1, CLK2, CLK3, CLK4), so using these characteristics, a 4:1 multiplexer can be implemented.

Accordingly, as shown in FIG. 2, the 4:1 multiplexer may be implemented as four input circuits that receive four data signals and a clock signal as shown in FIG. 2, or as an output circuit that receives all signals output from four input circuits and outputs one final output signal. However, in the case of having such a structure, the total parasitic capacitor of the output terminal of the multiplexer increases due to the parasitic capacitors C1 to C4 of the transistor itself constituting the circuit and the parasitic capacitors C5 to C8 generated due to routing as shown in FIG. 2, and thus there is a problem in that the output speed of the multiplexer itself is lowered.

SUMMARY OF THE DISCLOSURE

Technical Objects

Therefore, the high-speed 4:1 multiplexer according to an embodiment is an invention devised to solve the above-described problems, and by implementing the structure of the input terminal of the multiplexer as a two-stage structure of a two-layer structure, by reducing parasitic capacitors generated at the output terminal. There is an object to implement a multiplexer that increases the speed of the output stage compared to the prior art.

More specifically, by not connecting the four output signals output from the input circuit directly to the output circuit, but transmitting them to the output terminal through the addition circuit in the middle, even if four clock signals having a relatively slow phase difference are input, it aims to provide a multiplexer that does not reduce the speed.

Technical Solution

A high-speed 4:1 multiplexer according to an embodiment may comprise an input circuit unit including a first circuit that receives first data as an input signal, and outputs first output data as an output signal, a second circuit that receives second data as an input signal, and outputs second output data as an output signal, a third circuit that receives third data as an input signal, and outputs third output data as an output signal, and a fourth circuit that receives the fourth data as an input signal, and outputs the fourth output data as an output signal, a first stage for dividing the output data of the input circuit unit by two and receiving the input signal as an input signal, and outputting the first intermediate data and the second intermediate data as an output signal, and a second stage of receiving the first intermediate data and the second intermediate data as an input signal and outputting a final data as an output signal.

The first stage may include a first addition circuit for receiving the first output data and the third output data as an input signal and outputting the first intermediate data as an output signal.

A phase difference between clock signals input to the first circuit and the third circuit may have a phase difference of 180 degrees.

The first stage may include a second addition circuit for receiving the second output data and the fourth output data as an input signal and outputting the second intermediate data as an output signal.

A phase difference between clock signals input to the second circuit and the fourth circuit may have a phase difference of 180 degrees.

A phase difference between clock signals input to the first circuit and the clock signal input to the second circuit may have a phase difference of 90 degrees, a phase difference between clock signals input to the second circuit and the clock signal input to the third circuit may have a phase difference of 90 degrees.

A phase difference between clock signals input to the third circuit and the clock signal input to the fourth circuit may have a phase difference of 90 degrees, and a phase difference between clock signals input to the fourth circuit and the clock signal input to the first circuit may have a phase difference of 90 degrees.

The second stage may include a third addition circuit receiving the first intermediate data and the second intermediate data as an input signal and outputting the final data as an output signal.

The first intermediate data may be output by inverting the phases of the first output data and the second output data, the second intermediate data may be output by inverting the phases of the third output data and the fourth output data.

The first addition circuit and the second addition circuit may include NAND logic circuit or NOR logic circuit.

The third addition circuit may include NOR logic circuit.

The first addition circuit and the second addition circuit may include 1-stack-NAND logic circuit.

A high-speed 4:1 multiplexer according to another embodiment may comprise a first circuit that receives a first data as an input signal, and outputs a first output data as an output signal, a second circuit that receives a second data as an input signal, and outputs a second output data as an output signal, a third circuit that receives a third data as an input signal, and outputs a third output data as an output signal and a fourth circuit that receives a fourth data as an input signal, and outputs a fourth output data as an output signal, a first addition circuit receiving the first output data and the third output data as an input signal and outputting first intermediate data as an output signal, a second addition circuit receiving the second output data and the fourth output data as an input signal and outputting second intermediate data as an output signal and a third addition circuit receiving the first intermediate data and the second intermediate data as an input signal and outputting the final data as an output signal, wherein the pulse signals input to the first circuit, the second circuit, the third circuit and the fourth circuit have the same speed.

The first addition circuit and the second addition circuit include NAND logic circuit or NOR logic circuit.

A high-speed 4:1 multiplexer according to another embodiment may comprise a first circuit for receiving a 1-1 clock signal, a 1-2 clock signal having a phase difference of 90 degrees, and a first data as an input signal and outputting a first output data as an output signal, a second circuit receiving a 2-1 clock signal, a 2-2 clock signal having a phase difference of 90 degrees, and a second data as an input signal, and outputting a second output data as an output signal, a third circuit receiving a 3-1 clock signal, a 3-2 clock signal having a phase difference of 90 degrees, and third data as an input signal, and outputting a third output data as an output signal, a fourth circuit for receiving a 4-1 clock signal, a 4-2 clock signal having a phase difference of 90 degrees, and a fourth data as an input signal and outputting a fourth output data as an output signal, a first addition circuit receiving the first output data and the third output data as an input signal and outputting first intermediate data as an output signal, a second addition circuit receiving the second output data and the fourth output data as an input signal and outputting second intermediate data as an output signal, and a third addition circuit receiving the first intermediate data and the second intermediate data as an input signal and outputting the final data as an output signal, wherein the frequencies of the 1-1 clock signal, the 2-1 clock signal, the 3-1 clock signal, and the 4-1 clock signal all have the same value, but sequentially have a phase difference of 90 degrees.

The first addition circuit and the second addition circuit include NAND logic circuit or NOR logic circuit.

Effects of the Invention

Since the high-speed 4:1 multiplexer according to an embodiment has a 4:1 structure in which four input signals are output as one signal, even if a relatively slow clock signal is used as an input signal, there is an advantage in that the multiplexer can be operated more efficiently than a multiplexer having a 2:1 structure in which two input signals have one output signal.

In addition, since the plurality of addition circuits receive data output from the input circuit in the middle and then transmit a signal to the output terminal, the number of parasitic capacitors generated in the multiplexer becomes smaller than the number of parasitic capacitors generated according to the prior art. Accordingly, there is an advantage that can overcome the problem according to the prior art that the output speed of the multiplexer is lowered due to the parasitic capacitor.

Effects of the present invention are not limited to the technical problems mentioned above, and other effects not mentioned will be clearly understood by those skilled in the art from the following description.

BRIEF DESCRIPTION OF THE DRAWINGS

In order to more fully understand the drawings cited in the detailed description of the present invention, a brief description of each drawing is provided below.

FIG. 1 is a view illustrating an input pulse and a graph of calculation results of input pulses in order to explain a general operating principle of a 4:1 multiplexer.

FIG. 2 is a view for explaining a parasitic capacitor generated in a 4:1 multiplexer according to the prior art.

FIG. 3 is a circuit diagram illustrating a basic structure of a high-speed multiplexer according to an embodiment of the present invention.

FIG. 4 is a diagram illustrating a capacitor generated in a high-speed multiplexer according to an embodiment of the present invention.

FIG. 5 is a diagram illustrating waveforms of an input signal and an output signal when an addition circuit is implemented with NAND logic circuit according to an embodiment of the present invention.

FIG. 6 is a diagram illustrating waveforms of an input signal and an output signal when an addition circuit is implemented as a NOR logic circuit according to an embodiment of the present invention.

FIG. 7 is a circuit diagram of a high-speed multiplexer and a diagram showing waveforms output from each circuit according to another embodiment of the present invention.

FIG. 8 (*a*) is a circuit diagram of one-stack-NAND logic circuit, and FIG. 8 (*b*) is a circuit diagram of NAND logic circuit implemented in CMOS logic.

FIG. 9 is a waveform showing actual experimental results of a high-speed 4:1 multiplexer having a two-stage structure according to the present invention.

FIG. 10 is a diagram illustrating a comparison of output waveforms of a high-speed 4:1 multiplexer having a two-stage structure according to the present invention and a 4:1 multiplexer according to the prior art.

DETAILED DESCRIPTION OF THE PREFERRED EMBODIMENTS

The configuration shown in the embodiments and drawings described in this specification is only a preferred example of the disclosed invention, and there may be various modifications that can replace the embodiments and drawings of the present specification at the time of filing of the present application.

Throughout the specification, when a part is "connected" with another part, it includes not only the case where it is directly connected, but also the case where it is indirectly connected, and the indirect connection may include being connected via a wireless communication network.

In addition, terms used in the present specification are used only in order to describe embodiments rather than limiting or restricting the present invention. Singular forms are intended to include plural forms unless the context clearly indicates otherwise. In the present specification, it should be understood that the term "include", "comprise", or "have" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance.

In addition, terms including an ordinal number such as "first", "second", etc. used herein may be used to describe various elements, but the elements are not limited by the terms, and the terms are used only for the purpose of distinguishing one component from another. For example, without departing from the scope of the present invention, a first component may be referred to as a second component, and similarly, a second component may also be referred to as a first component.

In addition, terms such as "~part", "~group", "~block", "~member", and "~module" may mean a unit for processing at least one function or operation. For example, the terms may mean at least one process processed by at least one hardware such as a field-programmable gate array (FPGA)/application specific integrated circuit (ASIC), at least one software stored in a memory, or a processor.

The signs attached to each step are used to identify each step, and these signs do not indicate the order between the steps, and each step can be performed differently from the stated order unless the context clearly indicates a specific order.

Hereinafter, an embodiment according to the present invention will be described in detail with reference to the accompanying drawings.

FIG. 1 is a view illustrating an input pulse and a graph of calculation results of input pulses in order to explain a general operating principle of a 4:1 multiplexer, and FIG. 2 is a view for explaining a parasitic capacitor generated in a 4:1 multiplexer according to the prior art.

In the case of a 4:1 multiplexer using a current mode logic circuit according to the prior art, a combination of four clocks ((CLK1 & CLK2), (CLK2 & CLK3), (CLK3 & CLK4), (CLK4 & CLK1)) having a phase difference of 90 degrees as described above, each current mode logic circuit generates four 25% duty cycle pulses with only one phase out of a specific phase (0, 90, 180, 360). If a current mode logic circuit is driven using 25% duty cycle pulses, 4 pieces of information can be put in one cycle of the original clock (CLK1, CLK2, CLK3, CLK4), so the 4:1 multiplexer can be implemented.

However, when a 4:1 multiplexer is implemented through this method, as shown in FIG. 2, the gate logic circuit receiving four data (first data, second data, third data, and fourth data) is located in the multiplexer output terminal. In this case, the number of capacitors affecting the final output terminal increases due to the structural characteristic of receiving four data and finally outputting one data.

However, in the case of having such a structure, the total parasitic capacitor of the output terminal of the multiplexer increases due to the parasitic capacitors C1 to C4 of the transistor itself constituting the circuit and the parasitic capacitors C5 to C8 generated due to routing, and thus there is a problem in that the output speed of the multiplexer itself is lowered as shown in FIG. 2.

Therefore, the high-speed 4:1 multiplexer according to the present invention minimizes the occurrence of such parasitic capacitors to prevent the speed of the multiplexer from being lowered, and to efficiently operate the multiplexer only with a relatively slow clock. Hereinafter, it will be described in detail with reference to the drawings.

FIG. 3 is a circuit diagram illustrating a basic structure of a high-speed multiplexer according to an embodiment of the present invention.

Referring to FIG. 3, the high-speed multiplexer 100 according to an embodiment may include an input circuit unit 10 including a plurality of circuits and an addition circuit unit 50 including a plurality of addition circuits.

Specifically, the input circuit unit 10 may include a first circuit 11 receiving the first data D1 as an input signal and outputting the first output data as an output signal, a second circuit 12 receiving the second data D2 as an input signal and outputting the second output data as an output signal, a third circuit 13 for receiving the third data D3 as an input signal and outputting the third output data as an output signal, and a fourth circuit 14 that receives the fourth data D4 as an input signal and outputs the fourth output data as an output signal.

The addition circuit unit 50 may include a first addition circuit 21, a second addition circuit 22, and a third addition circuit 31.

Specifically, the first addition circuit 21 receives the output data of the first circuit 11 and the third circuit 13 as an input signal, and the second addition circuit 22 receives the output data of the second circuit 12 and the fourth circuit 14 as an input signal. The third addition circuit 31 receives the output data of the first addition circuit 21 and the second addition circuit 22 as input signals, and outputs the final output data of the high-speed 4:1 multiplexer 100 as an output signal.

On the other hand, in consideration of the sequential nature from the input terminal to the output terminal of the high-speed 4:1 multiplexer 100, the first addition circuit 21 and the second addition circuit 22 may be referred to as a first stage 20, the third addition circuit 30 may be referred to as a second stage 30, and the first addition circuit 21, the second addition circuit 22, and the third addition circuit 23 may be implemented as NAND logic circuit or NOR logic circuit.

As shown in the figure, the signal input to the first circuit 11 includes the first data D1, the 1-1 clock signal C1-1, and the 1-2 clock signal C1-2. The signals input to the second circuit 12 includes the second data D2, the 2-1 clock signal C2-1, and the 2-2 clock signal C2-2. The signal input to the third circuit 13 includes the third data D3, the 2-1 clock signal C2-1, and the 2-2 clock signal C2-2, and the signal input the fourth circuit includes the fourth data D4, the 4-1 clock signal C4-1, and the 4-2 clock signal C4-2.

In addition, in the 4:1 high-speed multiplexer 100 according to the present invention, clock signals input to each circuit have a phase difference in order to implement the function of the 4:1 multiplexer.

Specifically, the phase difference between the clock signal input to the first circuit 11 and the clock signal input to the second circuit 12 has a phase difference of 90 degrees, a phase difference between the clock signal input to the second circuit 12 and the clock signal input to the third circuit 13 has a phase difference of 90 degrees, a phase difference between the clock signal input to the third circuit 13 and the clock signal input to the fourth circuit 14 has a phase difference of 90 degrees, and a phase difference between the clock signal input to the fourth circuit 14 and the clock signal input to the first circuit 11 may have a phase difference of 90 degrees.

For example, when the 1-1 clock signal C1-1 is a clock signal having a phase of 0 degrees, the 1-2 clock signal C1-2 is a clock signal having a phase of 90 degrees, the 2-1 clock signal C2-1 is a clock signal having a phase of 90 degrees, and the 2-2 clock signal C2-2 may be a clock signal having a phase of 180 degrees. In addition, the 3-1 clock signal C3-1 is a clock signal having a phase of 180 degrees, the 3-2 clock signal C3-2 is a clock signal having a phase of 270 degrees, and the 4-1 clock signal C4-1 is a clock signal having a phase of 270 degrees, and the 4-2th clock signal C4-2 may be a clock signal having a phase of 0 degrees.

In the case of having the structure as shown in FIG. 3, since the 4:1 multiplexer has a 4 input and 1 output structure instead of a 2 input and 1 output structure, even a relatively slow clock signal (four phases required) can effectively drive a 4:1 multiplexer.

In addition, since the first addition circuit 21 and the second addition circuit 22 receive the data output from the input circuit unit 10 in the middle, and then transmit the processed intermediate data to the third addition circuit 31, the number of parasitic capacitors visible at the final output of the multiplexer is reduced.

Specifically, in relation to the parasitic capacitor generated in the high-speed 4:1 multiplexer 100 according to the present invention, only four parasitic capacitors are generated, the capacitors C1 and C2 generated by the transistors of the first addition circuit 21 and the second addition circuit 22 and the capacitors C3 and C4 generated by routing as shown in FIG. 4.

That is, the high-speed 4:1 multiplexer according to the present invention reduces the number of parasitic capacitors generated than the 4:1 multiplexer according to the prior art as seen in FIG. 2, there is an advantage of efficiently overcoming a problem of a decrease in output speed due to a parasitic capacitor.

So far, the structural features of the present invention have been described in detail. Hereinafter, the operating process of the present invention will be described in detail.

FIG. 5 is a diagram illustrating waveforms of an input signal and an output signal when an addition circuit is implemented with NAND logic circuit according to an embodiment of the present invention, and FIG. 6 is a diagram illustrating waveforms of an input signal and an output signal when an addition circuit is implemented as a NOR logic circuit according to an embodiment of the present invention.

According to an embodiment, when the addition circuit is implemented as NAND logic circuit, and as shown in FIG. 5, when input data and a pulse signal are input as an input signal of the high-speed 4:1 multiplexer 100, the input signal may be output as four pulse signals having a 25% duty cycle by the first step S10.

Specifically, the first circuit 11 outputs the first output data as an output signal, the second circuit 12 outputs the second output data as an output signal, and the third circuit 13 outputs the third output data as an output signal, the fourth circuit 14 may output the fourth output data as an output signal, and a waveform of each output data may be output as shown in FIG. 5. And the data output through the input circuits in this way is subjected to an operation process according to the second step S20 by the addition circuits.

Specifically, the first addition circuit 21 performs a NAND operation on the first output data and the third output data to output the first intermediate data as an output signal, and the second addition circuit 22 performs a NAND operation on the second output data and the fourth output data to output the second intermediate data as an output signal. In this case, output waveforms of the first intermediate data and the second intermediate data may be output as shown in FIG. 5.

The intermediate data output in this way may be finally output as a final output signal of the multiplexer after the third addition circuit 23 undergoes an operation according to the third step S30.

In another embodiment, when an addition circuit is implemented with a NOR logic circuit and input data and a pulse signal are input as an input signal of the high-speed 4:1 multiplexer 100 as shown in FIG. 6, the input signal may be output a four pulse signal having a 25% duty cycle as by step S10.

Specifically, the first circuit 11 outputs the first output data as an output signal, and the second circuit 12 outputs the second output data as an output signal, the third circuit 13 may output the third output data as an output signal, and the fourth circuit 14 may output the fourth output data as an output signal, and the waveform of the output data output from each of the circuits 11, 12, 13, and 14 may be output as shown in FIG. 6.

Compared to the case in which the addition circuit is implemented as a NAND logic circuit and the case where the addition circuit is implemented as a NOR logic circuit, since the phase of the input clock signal is different, the direction of an intermediate data having a 25% duty cycle output opposite to each other as shown in FIGS. 5 and 6.

The data output through the input circuits in this way is subjected to an operation process according to the second step S20 by the addition circuits.

Specifically, the first addition circuit 21 performs a NOR operation on the first output data and the third output data to output the first intermediate data as an output signal, the second addition circuit 22 may perform a NOR operation on the second output data and the fourth output data to output the second intermediate data as an output signal. In this case, output waveforms of the first intermediate data and the second intermediate data may be output as shown in FIG. 6.

The intermediate data output in this way may be output as a final output signal of the high-speed 4:1 multiplexer 100 through an operation process according to the third step S30 in the third addition circuit 23.

FIG. 7 is a circuit diagram of a high-speed multiplexer and a diagram showing waveforms output from each circuit according to another embodiment of the present invention, FIG. 8 (*a*) is a circuit diagram of one-stack-NAND logic circuit, and FIG. 8 (*b*) is a circuit diagram of NAND logic circuit implemented in CMOS logic.

In the case of the high-speed 4:1 multiplexer 100 according to FIG. 7, the basic structure is the same as that described above with reference to FIGS. 3 and 4, but there is a difference in that the first addition circuit 110 and the second addition circuit 120 are implemented as a NAND logic circuit, and the third addition circuit 130 is implemented as a NOR logic circuit.

The input circuits 11, 12, 13, and 14 according to FIG. 7 may output pulse-type data having a 25% duty cycle as described above. Specifically, when data is not input to the input circuit, "1" is output, and when data is input to the input circuit, "0" is outputted, and pulse-type data is generated and output.

The first output data, the second output data, the third output data, and the fourth output data in the form of pulses output by the first circuit 11, the second circuit 12, the third circuit 13, and the fourth circuit 14 have different timings to become "0" as shown in the figure, so there is no case where the data becomes 0 at the same time.

Accordingly, the first addition circuit 110 outputs a waveform of the same form as P5 after performing the NAND operation, and the second addition circuit 120 also outputs a waveform of the form P6 after performing the NAND operation, the data output in this way is input to the third addition circuit 130.

The high-speed 4:1 multiplexer 100 according to the present invention can finally operate as a 4:1 multiplexer because it does not include a section in which input data overlaps each other as shown in FIG. 7.

In addition, in the case of the high-speed 4:1 multiplexer according to FIG. 7, the first addition circuit 11 and the second addition circuit 12 may be implemented as a one-stack-NAND logic circuit shown in FIG. 8(a). In the case of implementing the addition circuit with the one-stack-NAND logic circuit shown in FIG. 8(a), there is an advantage in that the input capacitor can be made smaller than in the case of implementing the NAND logic circuit with the CMOS logic shown in FIG. 8(b) according to the prior art.

In addition, since the CMOS logic-based NAND logic circuit has a total of three stacks of transistors, the transistor resistance component increases due to an increase in the number of stacks, and the operation speed of the addition circuit may decrease. However, since the number of stacks does not increase when the addition circuit is implemented as a one-stack-NAND logic circuit as in the present invention, there is an advantage in solving this problem.

FIG. 9 is a waveform showing actual experimental results of a high-speed 4:1 multiplexer having a two-stage structure according to the present invention.

When the experimental conditions are described with reference to FIG. 9, the waveforms <1-1> to <1-4> according to FIG. 9 are corresponding the first input data, the second input data, the third input data, and the fourth input data of the present invention. At this time, the case where the data is "0" is regarded as inputted, and the case of "1" is regarded as the state in which data is not input.

In addition, in the clock waveforms of <2-1> to <2-4>, the first addition circuit 110 and the second addition circuit 120 are implemented as NAND logic circuits, and pulse type output data with 25% duty cycle output from the input circuit is generated as <3-1>~<3-4>, and each output data moves to "0" only at different timings.

Therefore, the first addition circuit 11 and the second addition circuit 12 according to the present invention perform a NAND operation on the first output data and the second output data, and finally the data in the form of <4-1> is outputted, and data in the form of <4-2> is also output for the second output data and the fourth output data. And the third addition circuit 13, which is the final stage, performs NAND operation on the pulses of <4-1> and <4-2>, and finally generates an output signal of a 4:1 multiplexer.

FIG. 10 is a diagram illustrating a comparison of output waveforms of a high-speed 4:1 multiplexer having a two-stage structure according to the present invention and a 4:1 multiplexer according to the prior art. Specifically, in FIG. 10, the green line is a waveform showing the eye-diagram of the 4:1 multiplexer implemented in the prior art, and the red line is the waveform showing the eye-diagram of the 4:1 multiplexer according to the present invention.

During the experiment, the 25% duty cycle pulse generator of the multiplexer according to the present invention and the 4:1 multiplexer according to the prior art was designed with the same performance, and the size of the load capacitor of the final stage was also designed to be the same, and the ratio and size of NMOS and PMOS in the final stage are also designed to match.

Referring to FIG. 10, the rise-time of the 4:1 multiplexer according to the prior art is 14.55 ps, the fall-time is 13.37 ps, and the rise-time of the 4:1 multiplexer according to the present invention is 12.28 ps, and the fall-time is 8.48 ps. That is, it can be seen that the performance of the 4:1 multiplexer according to the present invention is improved by 16% and 37% in rise-time and fall-time, respectively, than the 4:1 multiplexer according to the prior art.

So far, the configuration and process of a high-speed 4:1 multiplexer according to an embodiment have been described through the drawings.

Since the high-speed 4:1 multiplexer according to an embodiment has a 4:1 structure in which four input signals are output as one signal, even when using a relatively slow clock signal as an input signal, there is an advantage in that the multiplexer can be operated more efficiently than a multiplexer having a 2:1 structure in which two input signals have one output signal.

In addition, since the plurality of addition circuits receive data output from the input circuit in the middle and then transmit a signal to the output terminal, the number of parasitic capacitors generated in the multiplexer becomes smaller than the number of parasitic capacitors generated according to the prior art. Accordingly, there is an advantage that can overcome the problem according to the prior art that the output speed of the multiplexer is lowered due to the parasitic capacitor.

The device described above may be implemented as a hardware component, a software component, and/or a combination of the hardware component and the software component. For example, devices and components described in the embodiments may include, for example, a processor, a controller, an arithmetic logic unit (ALU), a digital signal processor, a microcomputer, a field programmable array (FPA), a programmable logic unit (PLU), microprocessor, or any other device capable of executing and responding to instructions by using one or more general purpose computers or special purpose computers.

The processing device may execute an operating system (OS) and one or more software applications running on the operating system. The processing device may also access, store, manipulate, process, and generate data in response to execution of the software. For convenience of understanding, although one processing device is sometimes described as being used, one of ordinary skill in the art will recognize that the processing device includes a plurality of processing elements and/or a plurality of types of processing elements. For example, the processing device may include a plurality of processors or one processor and one controller, and other processing configurations are possible, such as parallel processors.

Software may comprise a computer program, code, instructions, or a combination of one or more of these, and may be configured or independently or collectively instruct the processing device to operate as desired. The software and/or data may be embodied in any kind of machine, component, physical device, virtual equipment, computer storage medium or device, to be interpreted by or to provide instructions or data to the processing device. The software may be distributed over networked computer systems and stored or executed in a distributed manner. Software and data may be stored in one or more computer-readable recording media.

The method according to the embodiment may be implemented in the form of program instructions that can be executed through various computer means and recorded in a computer-readable medium. The computer-readable medium may include program instructions, data files, data structures, etc. alone or in combination. The program instructions recorded on the medium may be specially designed and configured for the embodiment, or may be known and available to those skilled in the art of computer software. Examples of the computer-readable recording medium include magnetic media such as hard disks, floppy disks and magnetic tapes, optical media such as CD-ROMs and DVDs, and magnetic such as floppy disks.—includes magneto-optical media, and hardware devices specially configured to store and execute program instructions, such as ROM, RAM, flash memory, and the like. Examples of program instructions include not only machine language codes such as those generated by a compiler, but also high-level language codes that can be executed by a computer using an interpreter or the like.

As described above, although the embodiments have been described with reference to the limited embodiments and drawings, various modifications and variations are possible from the above description by those skilled in the art. For example, the described techniques are performed in an order different from the described method, and/or the described components of the system, structure, apparatus, circuit, etc. are combined or combined in a different form than the described method, or other components or substituted or substituted by equivalents may achieve an appropriate result. Therefore, other implementations, other embodiments, and equivalents to the claims are also within the scope of the following claims.

The invention claimed is:

1. A high-speed 4:1 multiplexer comprising:
an input circuit unit including a first circuit that receives a first data as an input signal, and outputs a first output data as an output signal, a second circuit that receives a second data as an input signal, and outputs a second output data as an output signal, a third circuit that receives a third data as an input signal, and outputs a third output data as an output signal, and a fourth circuit that receives a fourth data as an input signal, and outputs a fourth output data as an output signal;
a first stage for dividing the output data of the input circuit unit by two and receiving as an input signal, and outputting a first intermediate data and a second intermediate data as an output signal; and
a second stage of receiving the first intermediate data and the second intermediate data as an input signal and outputting a final data as an output signal,
wherein the first stage includes a first addition circuit for receiving the first output data and the third output data as an input signal and outputting the first intermediate data as an output signal, and
wherein a phase difference between clock signals input to the first circuit and the third circuit has a phase difference of 180 degrees.

2. The high-speed 4:1 multiplexer of claim 1,
wherein the first stage includes a second addition circuit for receiving the second output data and the fourth output data as an input signal and outputting the second intermediate data as an output signal.

3. The high-speed 4:1 multiplexer of claim 2,
wherein a phase difference between clock signals input to the second circuit and the fourth circuit has a phase difference of 180 degrees.

4. The high-speed 4:1 multiplexer of claim 3,
wherein a phase difference between clock signals input to the first circuit and the clock signal input to the second circuit has a phase difference of 90 degrees,
a phase difference between clock signals input to the second circuit and the clock signal input to the third circuit has a phase difference of 90 degrees,
a phase difference between clock signals input to the third circuit and the clock signal input to the fourth circuit has a phase difference of 90 degrees, and
a phase difference between clock signals input to the fourth circuit and the clock signal input to the first circuit has a phase difference of 90 degrees.

5. The high-speed 4:1 multiplexer of claim 4,
wherein the second stage includes a third addition circuit receiving the first intermediate data and the second intermediate data as an input signal and outputting the final data as an output signal.

6. The high-speed 4:1 multiplexer of claim 5,
wherein the first intermediate data is output by inverting the phases of the first output data and the second output data,
the second intermediate data is output by inverting the phases of the third output data and the fourth output data.

7. The high-speed 4:1 multiplexer of claim 6,
wherein the first addition circuit and the second addition circuit includes NAND logic circuit or NOR logic circuit.

8. The high-speed 4:1 multiplexer of claim 7,
wherein the third addition circuit includes NOR logic circuit.

9. The high-speed 4:1 multiplexer of claim 6,
wherein the first addition circuit and the second addition circuit include 1-stack-NAND logic circuit.

10. A high-speed 4:1 multiplexer comprising:
a first circuit that receives a first data as an input signal, and outputs a first output data as an output signal;
a second circuit that receives a second data as an input signal, and outputs a second output data as an output signal;
a third circuit that receives a third data as an input signal, and outputs a third output data as an output signal; and
a fourth circuit that receives a fourth data as an input signal, and outputs a fourth output data as an output signal;
a first addition circuit receiving the first output data and the third output data as an input signal and outputting first intermediate data as an output signal;
a second addition circuit receiving the second output data and the fourth output data as an input signal and outputting second intermediate data as an output signal; and
a third addition circuit receiving the first intermediate data and the second intermediate data as an input signal and outputting the final data as an output signal;
wherein the pulse signals input to the first circuit, the second circuit, the third circuit and the fourth circuit have the same speed,
wherein a phase difference between clock signals input to the first circuit and the third circuit has a phase difference of 180 degrees.

11. The high-speed 4:1 multiplexer of claim 10,
wherein the first addition circuit and the second addition circuit include NAND logic circuit or NOR logic circuit.

12. A high-speed 4:1 multiplexer comprising:

a first circuit for receiving a 1-1 clock signal, a 1-2 clock signal having a phase difference of 90 degrees, and a first data as an input signal and outputting a first output data as an output signal;

a second circuit receiving a 2-1 clock signal, a 2-2 clock signal having a phase difference of 90 degrees, and a second data as an input signal, and outputting a second output data as an output signal;

a third circuit receiving a 3-1 clock signal, a 3-2 clock signal having a phase difference of 90 degrees, and third data as an input signal, and outputting a third output data as an output signal;

a fourth circuit for receiving a 4-1 clock signal, a 4-2 clock signal having a phase difference of 90 degrees, and a fourth data as an input signal and outputting a fourth output data as an output signal;

a first addition circuit receiving the first output data and the third output data as an input signal and outputting first intermediate data as an output signal;

a second addition circuit receiving the second output data and the fourth output data as an input signal and outputting second intermediate data as an output signal; and a third addition circuit receiving the first intermediate data and the second intermediate data as an input signal and outputting the final data as an output signal;

wherein the frequencies of the 1-1 clock signal, the 2-1 clock signal, the 3-1 clock signal, and the 4-1 clock signal all have the same value, but sequentially have a phase difference of 90 degrees.

13. The high-speed 4:1 multiplexer of claim 12, wherein the first addition circuit and the second addition circuit include NAND logic circuit or NOR logic circuit.

* * * * *